United States Patent
Liaw et al.

(10) Patent No.: US 7,280,392 B2
(45) Date of Patent: Oct. 9, 2007

(54) INTEGRATED MEMORY DEVICE AND METHOD FOR OPERATING THE SAME

(75) Inventors: Corvin Liaw, München (DE); Josef Willer, Riemerling (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/339,846

(22) Filed: Jan. 26, 2006

(65) Prior Publication Data

US 2006/0168505 A1    Jul. 27, 2006

(30) Foreign Application Priority Data

Jan. 26, 2005    (DE)    ..................... 10 2005 003 665

(51) Int. Cl.
    *G11C 11/00* (2006.01)
(52) U.S. Cl. .................. 365/163; 365/100; 365/148
(58) Field of Classification Search .................. 365/163
    See application file for complete search history.

(56) References Cited

U.S. PATENT DOCUMENTS

| 6,418,049 | B1 | 7/2002 | Kozicki et al. |
| 6,570,795 | B1 * | 5/2003 | Fricke et al. ............... 365/200 |
| 6,731,528 | B2 * | 5/2004 | Hush et al. .................. 365/100 |

* cited by examiner

*Primary Examiner*—Son L. Mai
(74) *Attorney, Agent, or Firm*—Edell, Shapiro & Finnan, LLC

(57) ABSTRACT

A memory device includes an array of memory cells that include a memory element having a non-reactive resistance whose magnitude is programmable to assume a high-resistance state or a low-resistance state. Sets of first and second lines provide access to the memory cells, wherein the memory element of each memory cell is coupled between one of the first lines and one of the second lines. A checking unit determines whether to invert data values to be stored in memory cells coupled to at least a section of respective ones of the first lines based on a number of memory cells that would be programmed in the high-resistance state or the low-resistance state as a result of the data values in order to reduce the number memory cells programmed in the low-resistance state and the resulting leakage current.

29 Claims, 9 Drawing Sheets

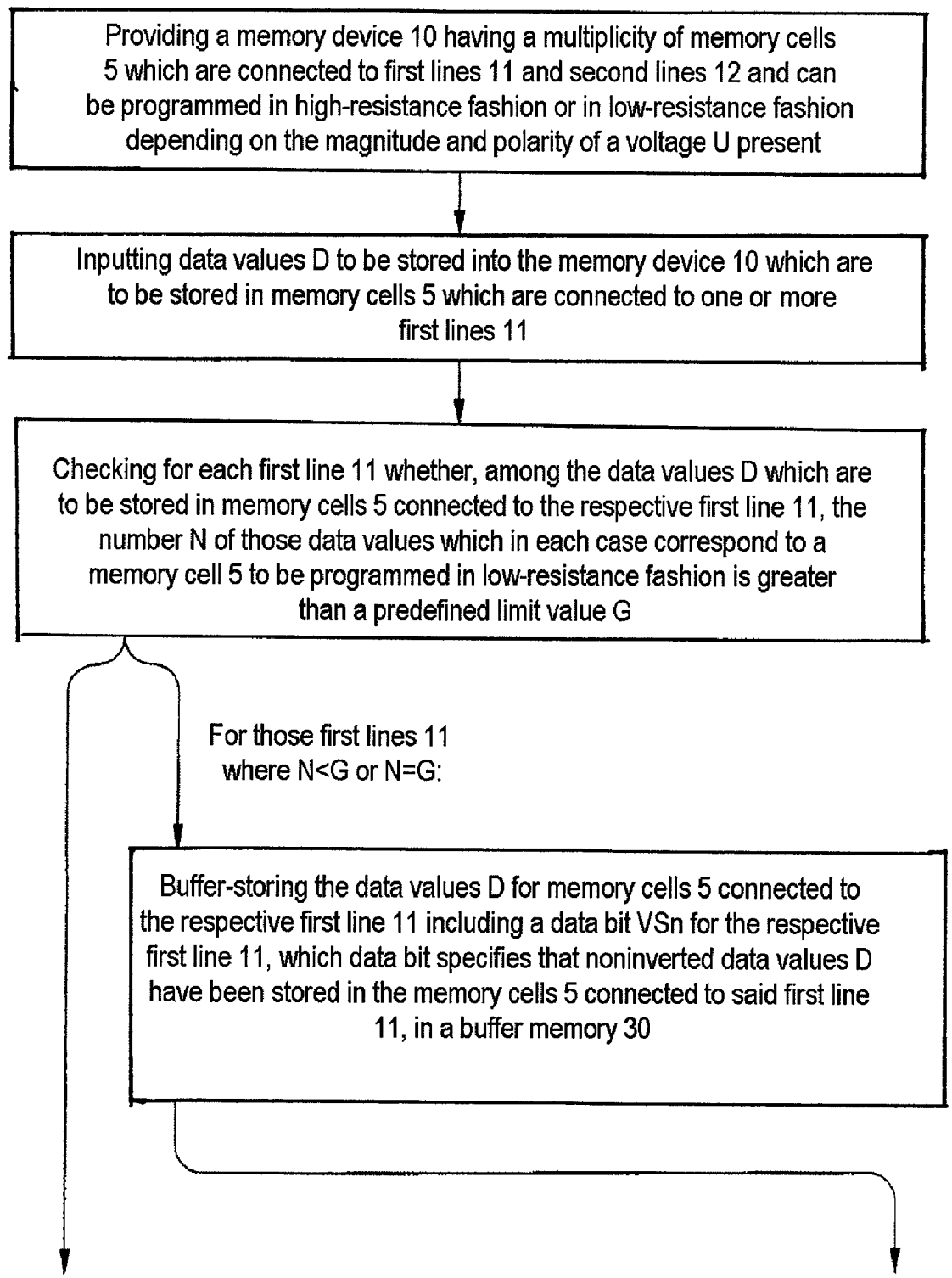

INTEGRATED MEMORY DEVICE AND METHOD FOR OPERATING THE SAME

CROSS REFERENCE TO RELATED APPLICATIONS

This application claims priority under 35 U.S.C. § 119 to German Application No. DE 102005003665.1, filed on Jan. 26, 2005, and titled "Integrated Memory Device and Method for Operating an Integrated Memory Device," the entire contents of which are hereby incorporated by reference.

FIELD OF THE INVENTION

The invention relates to an integrated memory device with memory cells whose memory elements have a non-reactive resistance that is programmable to different resistance levels.

BACKGROUND

Integrated memory devices, in particular semiconductor memories, can be classified based on the storage duration of stored information. Volatile semiconductor memories such as DRAMs (Dynamic Random Access Memories), for example, have memory cells that store written information only for fractions of seconds and therefore must be repeatedly refreshed. In nonvolatile semiconductor memories, by contrast, stored information is retained over a long period of time, typically over several years, even after the power supply has been switched off.

A particularly space-saving arrangement of memory cells is achieved in the case of such semiconductor memories whose memory cells have layer stacks at crossover locations between first lines (for example bit lines) and second lines (for example word lines), the non-reactive resistance of which layer stacks can be altered by applying suitable voltages directly via the first and second lines to which the layer stack extends. Memory cells formed in this way do not require a selection transistor. A memory cell array having such memory cells is referred to as a "cross-point array". The basic substrate area required per memory cell in the case of a "cross-point array" results from the pitch of the bit lines and the word lines, so that a cross-point array has a very high memory cell density.

Such a memory cell array has memory cells whose non-reactive resistance has a high value or a low value depending on the programming state. In either case, along the layer stacks, leakage currents arise between the first and second lines to which the layer stacks are connected. Each individual layer stack enables a leakage current between that first line and that second line to which the layer stack extends (and the memory cell is thus connected). In the case of a memory cell programmed in a high-resistance state, its leakage current contribution is usually negligible. Problems exist, however, in the case of those memory cells that are in a low-resistance memory state. Larger leakage currents flow along the layer stacks of such memory cells and, in view of the high number of memory cells per word line or per bit line, may produce considerable leakage current contributions along the lines. Particularly when the total of memory cells programmed in a low-resistance state which are connected along one and the same line is very large, an electrical potential applied to one end of the relevant line may vary (for example decrease) considerably along the course of the line, with the result that a reliable biasing of the entire line becomes all the more difficult, the more memory cells are connected to the respective line. The more memory cells are connected to a word line or bit line and the longer the corresponding line thus is, the more difficult it is to be able to guarantee that a predefined electrical potential will be complied with over the entire interconnect length.

Since memory devices formed as cross-point arrays, for example solid-electrolyte memory devices, are operationally reliable only when predefined bit line and word line potentials are ensured with arbitrary data patterns stored in a memory cell array, the permissible interconnect length (measured in the number of memory cells per line) up to which such a memory device can still be operated reliably is limited. The maximum permissible number, for functionally reliable operation, of memory cells that are programmed in a low-resistance state and are connected to the same line conventionally prescribes the maximum permissible interconnect length of such lines, since memory devices formed as cross-point arrays must function reliably even when the entire memory cell array is occupied with data values corresponding to a memory state programmed in a low-resistance state.

SUMMARY

The present invention provides an integrated memory device of the type described above that can be operated reliably with even greater interconnect lengths of its first and/or second lines, i.e., with an even greater number of memory cells per line. In particular, the intention is for reliable operation of such a memory to be made possible even when the number of memory cells connected to one and the same line is greater than the maximum permissible number of memory cells which are permitted to be simultaneously programmed in a low-resistance state for functionally reliable operation. Furthermore, the present invention provides a method for the functionally reliable operation of such a semiconductor memory.

In particular, the memory device is formed such that, prior to performing a storage, at least for one type of line (e.g., the first lines), a check is made to determine whether or not data values to be stored in memory cells connected to the respective first line are inverted prior to the storage operation, the check being performed in a manner dependent on a condition which depends on the number of memory cells programmed in a high-resistance state which are connected to the first line or to a section of the first line, and/or on the number of memory cells programmed in a low-resistance state which are connected to the first line or to the section of the first line.

According to the invention, it is provided that, prior to each storage operation in which memory cells are reprogrammed, a test is performed in which a check is made to determine whether or not data values to be stored are inverted prior to the storage. In the case of this check, the decision as to whether the data to be stored are inverted is made dependent on a condition which depends on the number of high-resistance memory cells and/or on the number of low-resistance memory cells which are connected to the relevant line and which are overwritten (with the same or with changed data values) during the storage operation. Consequently, the invention provides an inversion of data values to be stored, which is performed by the memory device. However, the inversion is not effected automatically during every storage operation, but rather in a manner dependent on the data values themselves. In particular, the inversion is effected in a manner dependent on a number of data values that are to be stored along the same line and which correspond to a low-resistance programming state.

Consequently, on the basis of the level of the number of data values which are to be stored along the same line and which correspond to a low-resistance programming state, the memory device makes a decision as to whether or not the data values are inverted prior to the storage of these data values. As a result, when the number of data values corresponding to a low-resistance programming state along the same line becomes very large, data inversions can be performed selectively along individual lines, to be precise, prior to the actual storage of the data values along the affected line. As a result, particularly when the storage of non-inverted memory data would lead to such a large number of low-resistance memory cells on the same line that functionally reliable operation would no longer be ensured, it is possible to insert an inversion step in the case of which the inverted data values are stored instead of the original, non-inverted data values. The inverted data values then form those data values which are overwritten during the storage operation into the memory cells along the relevant line.

The invention's checking for the expediency of a data inversion which is limited to the memory cells along a line is, in particular, implemented individually for each line, at least for those lines which are affected by a storage operation. For every such line, the check is effected and, if appropriate, the inversion is effected independently of the data values to be stored along the other lines which run parallel. Consequently, for each line to which memory cells that are to be overwritten during the storage operation are connected, on account of the number of memory cells to be programmed in a low-resistance state along the respective line, it is possible to decide individually whether a data inversion is effected prior to the data storage. As a result, a data inversion can be performed selectively on those lines for which the storage of the data values would lead to an excessively high number jeopardizing functionally reliable operation) of memory cells programmed in a low-resistance state, before the data values (which are non-inverted or inverted according to the line) are stored. As a result, it is possible to provide even greater line lengths to which more memory cells are connected than in the case of conventional memory devices, and it is possible for memory data to be reliably written in, stored and later read out again. Owing to the invention's checking and, if appropriate, inversion, a memory state in which, in the memory cells along a line, all or very many of the memory cells are programmed in a low-resistance state no longer occurs; such a state is avoided by inversion performed word line by word line or bit line by bit line according to the invention.

It is preferably provided that the memory device, prior to a storage of the data values, checks whether the number of memory cells programmed in a low-resistance state which are connected to the respective line or to the section of the respective line is less in the case of storing inverted data values than in the case of storing non-inverted data values. Consequently, as early as prior to the actual storage operation, a check is made to determine whether a previous inversion is suitable for reducing the number of memory cells programmed in a low-resistance state along the lines. If this is the case, then an inversion is performed in the case of the affected lines for which such an inversion will reduce the number of low-resistance memory cells.

It is preferably provided that the memory device, prior to a storage, checks whether a limit value for a maximum permissible number of memory cells programmed in a low-resistance state which are connected to the respective line or to the section of the respective line is exceeded. The limit value specifies, by way of example, how many low-resistance memory cells per line to which the memory cells are connected are permitted to be maximally programmed in a low-resistance state. On the basis of such a condition, the memory device can easily decide whether and for which lines an inversion of the data values to be stored is advantageous and is performed.

It is preferably provided that when the check reveals that, in the case of a non-inverted storage of the data values, the number of the memory cells programmed in a low-resistance state which are connected to the respective one line or to the section of the respective one line is greater than the limit value, the memory device inverts the data values prior to the storage operation. The memory device inverts the data values only for those lines for which the comparison with the limit value reveals that, without an inversion, more memory cells will be simultaneously programmed in a low-resistance state than is permissible along a line in order to ensure functionally reliable operation.

It is preferably provided that the limit value for the maximum permissible number of memory cells programmed in a low-resistance state which are connected to the respective line amounts to half the number of all memory cells connected to the respective line. In this embodiment, a limit value is chosen which is half as large as the number of memory cells per line, for instance per word line. This condition has the effect that an inversion takes place whenever for a line, in the case of a non-inverted storage, more than half of the memory cells connected to the line would be programmed in a low-resistance state and would thus make a larger leakage current contribution than in the case of a storage of inverted data values. Consequently, in this embodiment, it is always ensured for arbitrary data patterns that the smallest possible number of memory cells programmed in a low-resistance state is attained. For this purpose, for each line, for example for each word line, a check is performed individually to determine whether an inversion reduces the memory cells programmed in a low-resistance state, and, if appropriate, an inversion is performed. The limit value may also assume any other arbitrary numerical value; by way of example, it may be greater than half the number of memory cells which are connected to the same line, for instance the same word line. Thus, it may be provided, for instance, that an inversion is performed only above a limit value which lies below the total number of memory cells per line by a specific factor or by a specific numerical value. In such a case, an inversion need not be performed every time the number of memory cells to be programmed in a low-resistance state is only slightly greater than half the number of memory cells which are connected to the same line.

It is preferably provided that the memory device, during each programming operation, additionally stores at least one data bit representing a line-specific inversion state of the data values stored along the respective line or along the section of the respective line. This data bit specifies whether or not the data values stored along the line are stored (or to be stored) in an inverted manner. By way of example, the data bit may be a digital zero if the data values are stored in a non-inverted manner, and a digital one if the data values are stored in an inverted manner, or vice versa. The inversion steps being limited to individual lines, for example to individual word lines, always ensures a sufficient voltage stability when biasing the lines by which the memory cells are accessed. Such a data bit which indicates an inversion performed for maintaining the voltage stability may therefore also be referred to as a "voltage stability bit". Consequently, for each line, for example each word line, a data bit is provided which is stored together with the data values and which specifies whether the data values correspond to the information to be stored or the inverted information. If the data bit indicates an inverted storage, the data values can be inverted back again during read-out in order to obtain the original data values.

Accordingly, it is provided that the memory device during each storage operation, stores at least one data bit which is assigned to the respective line or to the respective section of the line and specifies whether or not the data values to be stored along the respective line or along the respective section of the line are inverted. During a storage operation, a so-called "page", i.e., a set of data values to be jointly stored, is usually written to memory cells. The extent and form of the page may be configured in an arbitrary manner; in particular, a page may extend over the complete length of first and/or second lines or alternatively only over individual or a plurality of sections of the first and/or second lines. Furthermore, a page may contain data values for a plurality of memory blocks, for example also data values for respectively different interconnect sections from different memory blocks. Particularly when a page does not extent over the complete length of lines to which the memory cells are connected, but rather only over part of the interconnect length, it is advantageous to provide, for each line, a plurality of data bits which specify only for a section of the relevant line whether an inversion of the data values is to be performed.

It is preferably provided that the memory device is formed such that both the data values to be stored and the data bits are always stored in the memory cells during the storage operation. In this case, a data bit in addition to the actual data values is stored for each line, for example for each word line.

It is preferably provided that the memory device is formed such that during each storage operation, a check is made for each first line to determine whether the data values for memory cells which are connected to the respective first line or to the section of the respective first line are to be stored in a non-inverted manner or in an inverted manner for the purpose of reducing the number of memory cells programmed in a low-resistance state, and that, during the storage, at least one data bit which is assigned to the respective first line and which specifies the inversion state of data values stored with the aid of the respective first line is stored simultaneously for each of the first lines. Consequently, prior to each storage operation, a check is made to determine whether a reduction of the number of memory cells programmed in a low-resistance state is achieved by the storage of the inverted data values or by the storage of the non-inverted data values. This check is performed for each affected first line, for example for each word line. In the case of those lines for which an inversion increases or leaves unchanged the number of memory cells programmed in a low-resistance state along the respective first line, the data is stored without previous inversion. By contrast, in the case of those lines for which an inversion reduces the number of memory cells programmed in a low-resistance state, an inversion is first performed.

It is preferably provided that the memory device is formed such that the data bits which represent the inversion states specific to the respective first lines are stored in the first or in the last memory cell that is connected to the respective first line. Consequently, at the edge of a memory block of memory cells which are connected up to one another by the first and second lines, a row or a column can be used to store the data bits which specify the inversion states along the respective first and/or second lines. As an alternative, the data bits may, however, also be stored in a different column and/or in a different row of the memory block or else separately outside the memory cell block. In all cases it is possible, during the read-out of memory contents, on the basis of the data bits which indicate an inversion performed along a first line and/or an inversion performed along a second line, to reconstruct the original data pattern of the data values that is to be stored.

It is preferably provided that the storage device always store data bits representing the line-specific inversion states of data values in a non-inverted state. In this case, the data bits identifying the inversion state are themselves not affected by a possible inversion, so that, from the value of these data bits, it can be unambiguously determined whether or not the rest of the data values were stored in an inverted manner. Provision could equally be made for storing the data bits specifying the line-specific inversion states always, i.e., in each case, in inverted manner. An unambiguous assignment between the value of the data bits and the determination of whether or not all inversions of the rest of the data values have taken place is achieved in this case too.

It may be provided that the memory device performs an inversion step prior to a storage operation, in which inversion step an inversion of the data values which are to be stored in the memory cells connected to the respective first line is performed for those first lines for which the number of connected memory cells programmed in a low-resistance state is less in the case of an inversion than in the case of a non-inverted storage.

As an alternative, it may be provided that the memory device performs an inversion step prior to a storage operation, in which inversion step an inversion of the data values which are to be stored in the memory cells connected to the respective section of the relevant first line is performed for those sections of first lines for which the number of connected memory cells programmed in a low-resistance state is less in the case of an inversion than in the case of a non-inverted storage. In the case of this alternative embodiment, only a section of the corresponding line, instead of the entire line, is taken into consideration during the checking to determine whether an inversion of data values is expedient.

It may be provided that the memory device performs a further inversion step in addition to the inversion step prior to the storage operation, in which further inversion step an inversion of those data values which are to be stored in memory cells connected to the respective second line is performed for each second line for which the number of connected memory cells which are programmed in a low-resistance state can be reduced by an inversion. In the case of this embodiment, the data patterns which have already been optimized along the first lines for a minimum number of memory cells programmed in a low-resistance state are additionally optimized even further along the second lines. As a result, along the second lines, too, it is possible to reduce the number of memory cells programmed in a low-resistance state which are connected to the same respective second line. This makes it possible to operate in a functionally reliable manner memory devices having memory cell arrays in which the interconnect length of the second lines is additionally increased as well and in which more memory cells are connected to each second line than are permitted to be simultaneously programmed in a low-resistance state along the second lines. While the first inversion step is performed along the first lines prior to the data storage, the further optimization is effected along the second lines preferably after the storage operation. This is advantageous when the data values are usually overwritten along the first lines, for example word line by word line, during a reprogramming operation. The data values to be stored for one or else a plurality of memory blocks are preferably firstly buffer-stored in a buffer memory, for example in an SRAM, in order to be able to perform possible inversion steps therein before the data values are finally written to the memory block or memory blocks. This has the advantage that once data has been stored in the memory blocks, it does not have to be read out again for instance in order to be able to perform inversion steps along the second lines. Instead, inversion steps can be performed on the data values which are to be stored and which are still buffer-stored in the SRAM, in order to reduce the number of memory cells to be programmed in a low-resistance state both along the first lines and along the second lines.

As an alternative, it may be provided that the memory device performs a further inversion step in addition to the inversion step prior to the storage operation, in which further inversion step a further inversion of those data values which are to be stored in memory cells connected to the respective section of the relevant second line is performed for at least one section of each second line for which the number of memory cells which are to be programmed in a low-resistance state and which are connected to the respective section of the relevant second line can be reduced by an inversion.

It is preferably provided that the memory device stores, for each second line, at least one data bit which specifies whether an inversion for reducing the number of memory cells programmed in a low-resistance state was performed for the data values which are stored in memory cells connected to the respective second line or the respective section of the second line. In this case, a dedicated data bit is provided both for each first line and for each second line, which dedicated data bit indicates whether an inversion step limited to the respective first or second line has been performed. Consequently, the original data values can be reconstructed again when reading out data values from the memory device.

The memory device may be formed such that an inversion can be performed for a plurality of sections of each first line, the memory device performing an inversion only for such sections of first lines for which the number of memory cells that are to be programmed in a low-resistance state can be reduced by an inversion.

Moreover, the memory device may be formed such that an inversion can be performed for a plurality of sections of each second line, the memory device performing an inversion only for such sections of second lines for which the number of memory cells that are to be programmed in a low-resistance state can be reduced by an inversion.

It is preferably provided that the memory device assigns to each section an arbitrary first line and/or to each section of an arbitrary second line a data bit specifying whether data values have been stored in an inverted manner or in a non-inverted manner along the respective section.

It is preferably provided that the memory device stores the data values to be stored and the data bits which identify the inversion state firstly in a buffer memory, then performs in the buffer memory inversion steps that are to be performed for the purpose of reducing the number of memory cells that are to be programmed in a low-resistance state, and only afterward writes the data values stored in the buffer memory to the memory cells. In the last step, the data bits which identify the inversion state (inversion bits) can also simultaneously be written to the memory cells. In particular, the information to be stored may firstly be buffer-stored in a buffer memory, for example an SRAM (static random access memory), prior to the actual storage. In the buffer memory, prior to the actual storage, it is possible firstly to perform the inversion steps in order to reduce the number of low-resistance memory cells along the first and/or the second lines. The data bits which identify the inversion states may also be buffer-stored in the buffer memory. After the inversion steps have been performed, the data values thus processed, including the data bits which identify the inversion states, may be transferred from the buffer memory into the memory cell array. In particular, it may be provided that the data values are transferred from the buffer memory into the memory cell array only after the data values have been optimized by inversion steps both with regard to the first lines and with regard to the second lines along which the fewest possible low-resistance memory cells are intended to occur in each case.

It is preferably provided that data values that are to be stored or are stored with the aid of the first lines in the memory device can be inverted row by row. The first lines are thus such lines which connect rows of memory cells in a memory cell array. These are usually the word lines.

Furthermore, it is preferably provided that data values that are to be stored or are stored with the aid of the second lines in the memory device can be inverted column by column. The second lines thus respectively connect memory cells of a column of a memory cell array; such lines are usually referred to as bit lines and are connected to sense amplifiers.

It is preferably provided that the memory device has a plurality of memory blocks having memory cells, each memory block having dedicated first and second lines by which the memory cells of the respective memory block are interconnected, and that the memory device stores, for the lines of each memory block, dedicated data bits which are independent of one another and which identify the inversion state of memory cells connected to the respective line or to a respective section of the relevant line only within an individual memory block. This development takes account of the fact that in the case of a semiconductor memory having a plurality of memory blocks, i.e., separate memory cell arrays with dedicated word lines and bit lines, different data patterns are to be stored for each memory block and, consequently, the decision as to whether an inversion is performed for a specific first or second line of a memory block may turn out differently for each memory block. In this case, the configuration of the page, i.e., of the set of data values to be stored jointly, may be configured differently for each block of memory cells; it may for example relate to different sections of first and/or second lines of the different memory blocks, or extend over the complete length of first and/or second lines in one memory block and, in another memory block, extend only over sections of the respective lines of the memory block. Therefore, the first and/or second lines of each memory block require dedicated data bits which identify the inversion steps performed line by line or line section by line section in the respective memory blocks.

It is preferably provided that the magnitude of the non-reactive resistance of the memory elements can be altered by the magnitude of an electrical voltage between the respective first line and the respective second line to which the respective memory element extends. Memory cells having such memory elements are resistively switching memory cells which can be reprogrammed solely by the level and the polarity of a voltage present at them.

In particular, it is provided that the memory device is formed such that the memory cells acquire high resistance through application of a sufficiently high programming voltage of a first polarity and acquire low resistance through application of a sufficiently high programming voltage of a second, opposite polarity.

In particular, it may be provided that the memory elements of the memory cells are a layer stack having a solid electrolyte and having a metal-containing layer adjoining the solid electrolyte.

By way of example, semiconductor memories whose storage medium contains a solid electrolyte may be produced in this design. A layer stack which has both a layer made of the solid electrolyte and the metal-containing layer is connected to interconnects at opposite end areas. Electrical voltages can be applied via the interconnects. The layer stack arranged respectively between a bit line and a word line has a current flowing through it upon application of the voltage between the bit line and the word line. The magnitude of the current is dependent on the non-reactive resistance of the layer stack.

On one side of a layer formed from a solid electrolyte, the layer stack has a metal-containing layer. Depending on the current direction and intensity of the applied voltage, metal ions originating from the metal-containing layer either diffuse into the layer from the solid electrolyte or from the latter back into the metal-containing layer. If the metal ions which have diffused into the layer from the solid electrolyte have diffused as far as the interface of the solid-electrolyte layer which is remote from the metal-containing layer, the non-reactive resistance of the layer stack decreases overall; the nonvolatile memory cell is switched in a low-resistance state, which corresponds for example to a programmed memory state. Upon application of a sufficiently high voltage of opposite polarity, the ions are driven out from the solid electrolyte, namely back to the metal-containing layer. As a result, a high-resistance state of the memory cell is re-established and the memory cell is erased again.

Nonvolatile semiconductor memories having the design described above are also referred to PMC (Programmable Metallization Cell) or else CBRAM (Conductive Bridging Random Access Memory). Memory cells of this type are resistively switching elements, i.e., elements that switch in a resistance-dependent manner. The magnitude of the non-reactive resistance of the layer stack of each individual cell represents an item of memory information, which, depending on whether the layer stack has high resistance or low resistance, signify a digital "0" or "1". The stored information physically results from the distribution of the indiffused metal ions within the solid electrolyte. This distribution and the resultant memory state (high resistance or low resistance) can be read out by applying a measurement voltage between the bit line and the word line to which the memory cell is connected.

Solid-electrolyte memory cells do not have precise limit values—identical for all the memory cells of the same memory circuit—for those threshold voltages at which the transition from the high-resistance state to the low-resistance state, or vice versa, takes place. By way of example, the minimum value for the erase voltages, at which an originally low-resistance memory cell acquires high resistance, varies from cell to cell within the same memory circuit. The minimum value for the write voltage (having a positive sign), above which an originally high-resistance memory cell acquires low resistance, likewise varies from cell to cell. Consequently, instead of discrete threshold voltages, threshold voltage ranges having a comparatively large bandwidth with regard to the voltages to be applied which are required for a reprogramming of the memory cells exist in present-day solid-electrolyte semiconductor memories. The bandwidths of the threshold voltages are also not inconsiderable in comparison with the mean value of the respective threshold voltage. The bandwidth of the erase voltages (i.e., the distribution of the memory-cell-specific values of the minimum erase voltage) over the applied voltage is often greater than the bandwidth of the write voltages, i.e., of the programming voltages. In particular, the magnitude of the smallest possible erase voltage at which at least some memory cells acquire high resistance, if they are biased with this voltage, is also less than that write voltage at which at least one of the memory cells acquires low resistance, if biased with this write voltage.

Consequently, the threshold voltages for both reprogramming operations, namely the erase voltages and the write voltages, are not identical in terms of magnitude. Moreover, the statistical distribution of the level of the erase voltages and the level of the write voltages are not symmetrical with respect to one another as regards an inversion of the sign of the applied voltage. If, by way of example, a positive voltage of a specific minimum magnitude already reliably leads to the programming of a memory cell, to be precise independently of which individual memory cell is biased therewith, then a negative voltage of identical absolute magnitude need not yet necessarily lead to an erase operation in the memory cell biased with it. This is because, on account of the wider distribution of the erase voltages compared with the write voltages, there exist in the memory circuit memory cells which acquire high resistance only at negative voltages that are even greater in terms of magnitude.

Since in a semiconductor memory the memory state, i.e., the level of the non-reactive resistance of the respective memory cells, must be unambiguously defined, for a write or erase operation the applied voltages must lie outside the bandwidths of the write voltages and the erase voltages.

A voltage for a reprogramming operation is applied between the bit line and the word line. Since, however, in the case of a solid-electrolyte semiconductor memory formed as a cross-point array, a plurality of memory cells are connected to each bit line and each word line but no selection transistors are present, all the memory cells which are connected to the respective line would be reprogrammed upon application of the respective programming voltage exclusively via the bit line or exclusively via the word line. For this reason, in order to write an item of information to a memory cell, the required write voltage is applied to the bit line and to the word line in the form of two partial voltages which together produce the required write voltage. By way of example, the potential of the bit line to which the memory cell is connected is increased by a specific magnitude and the potential of the word line to which the memory cell is connected is simultaneously reduced by a specific magnitude.

Since, however, no selection transistors are present in a cross-point array, the partial voltages are also simultaneously present at those layer stacks which are connected to the same bit line but a different word line, or to the same word line but a different bit line. At least for such a storage operation in which the memory cells are transferred from a high-resistance programming state to a low-resistance programming state (i.e., during a write operation), the partial voltages may be chosen to be below the lower bandwidth limits, so that exclusively the memory cell situated at the crossover point of the selected bit line and the selected word line is programmed. This is possible because in solid electrolyte memory circuits, the bandwidth of the write voltages is small enough to choose for writing a positive voltage of 2ΔV, for example, such that it is greater than the upper limit of the bandwidth of the write voltages, but is nonetheless so small that half of this voltage ΔV is less than the lower limit of the bandwidth of the write voltages. A reliable driving of the memory cells and a reduction of voltage drops along the first and second lines are particularly important precisely for solid-electrolyte memory cells in which the threshold voltages for the reprogramming operations do not have fixed voltage values, but rather are distributed statistically over a relatively large bandwidth of voltages.

The bandwidth of the write voltages is less than the bandwidth of the erase voltages, and the absolute magnitude of the negative write voltage at which at least some memory cells are programmed is greater than the minimum value of the erase voltage at which at least some of the memory cells are already erased.

For the opposite reprogramming operation, namely erasure, selective access to individual memory cells is not possible owing to the even larger bandwidth of the erased voltages in solid-electrolyte semiconductor memories. Instead, whole rows, columns or blocks of memory cells are always erased simultaneously. However, they can be used as flash memories whose memory cells can be accessed individually at least during programming, i.e., during writing.

It is preferably provided that the second lines run in a direction transversely with respect to the course of the first lines. In particular, it is provided that the first lines are word lines and the second lines are bit lines. Conversely, it is also possible for the first lines to be bit lines and the second lines to be word lines.

According to another aspect of the invention, a method for operating an integrated memory device, includes: providing an integrated memory device having a plurality of memory cells connected to first and to second lines and having a variable non-reactive resistance, which are programmable such that they assume either a first, high-resistance programming state or a second, low-resistance programming state; inputting data values to be stored into the integrated memory device; checking to determine for which of the first lines or for which sections of first lines a number of memory cells which are connected to the respective first line and which are to be programmed in a low-resistance state after a storage of the data values can be reduced by an inversion of the data values in those memory cells which are connected to the respective first line; performing an inversion step that involves inverting those data values which are to be stored in memory cells which are connected to such first lines or to such sections of first lines for which the check reveals that an inversion reduces the number of cells programmed in a low-resistance state; and storing the data values.

It is preferably provided that a limit value is predefined for the maximum permissible number of memory cells programmed in a low-resistance state which are permitted to be simultaneously connected to a first line or to a section of a first line, and checking to determine for which of the first lines or for which sections of the first lines the number of memory cells which will acquire low resistance after a storage of the data values and which are connected to the respective line is greater than the predefined limit value. The same check may equally be performed for the second lines or the line sections thereof. In this case, the method then involves inverting those data values which were determined for a storage in memory cells connected to such first lines to which, in the case of a non-inverted storage, more memory cells programmed in a low-resistance state would be connected than is permitted in accordance with the predefined limit value.

It may be provided that the limit value for the maximum permissible number of memory cells programmed in a low-resistance state per first line is chosen such that it is half as large as the number of all memory cells connected to a first line. As an alternative, it may be provided that the limit value is greater than half the number of all the memory cells connected to a first line. The limit value may amount for example to between 50 and 75 percent of the number of memory cells per first line.

It is preferably provided that those stored data values are inverted which are stored in memory cells along such second lines or along such sections of second lines for which the number of connected memory cells programmed in a low-resistance state can be reduced by an inversion. Consequently, a further inversion step is performed, in which the data is not inverted row by row but rather column by column (or vice versa), to be precise, only along those second lines for which such an inversion results in a reduction of the number of connected low-resistance memory cells. After such a further inversion, a row-by-row inversion may again be carried out subsequently, optionally also followed by yet another column-by-column or a plurality of iterative inversions.

A memory device as described above is preferably operated by one of the methods described here.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
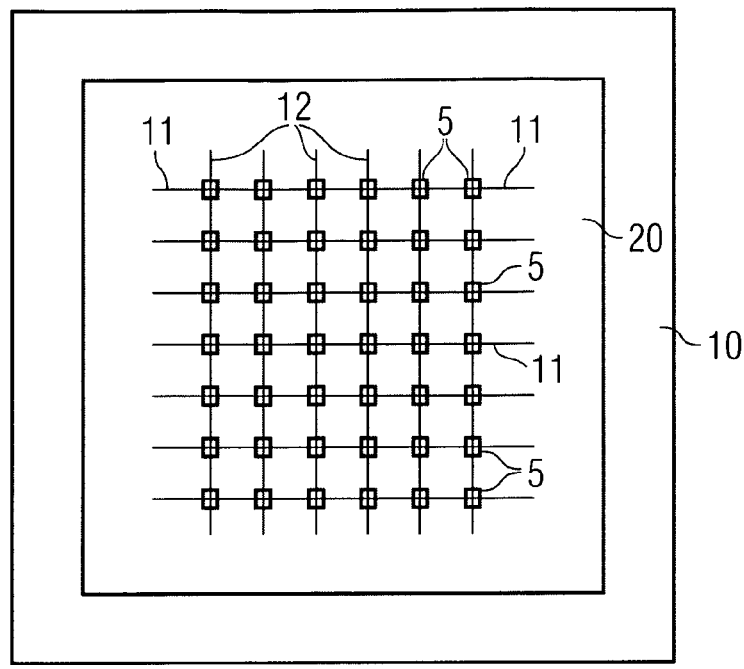
FIG. 1 shows a schematic plan view of an integrated memory device with an arrangement of non-volatile memory cells.

FIG. 1 shows a schematic plan view of an integrated semiconductor memory 10 with an arrangement 20 of nonvolatile memory cells 5. The arrangement 20 furthermore has a plurality of first lines 11 and second lines 12 which can be electrically biased for the programming and erasure of the memory cells 5. Each memory cell 5 is connected to precisely one first line 11 and to precisely one second line 12; the arrangement 2 forms a cross-point array, the memory cells 5 of which do not require a selection transistor. The memory cells 5 are, in particular, solid-electrolyte memory cells.

Figure 2:
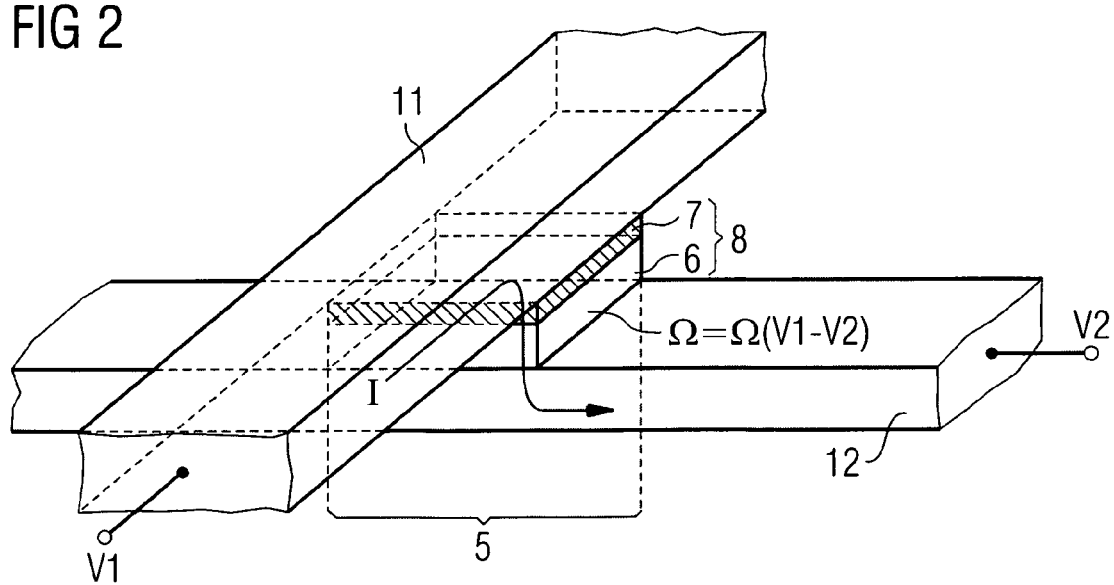
FIG. 2 shows a perspective view of a memory cell of the memory device from FIG. 1.

FIG. 2 shows a perspective view of a memory cell 5 of the semiconductor memory 1 from FIG. 1. Where a first line 11 crosses over a second line 12, a layer stack 8 is arranged between the first line 11 and the second line 12, the layer stack connecting the first line 11 to the second line 12. Consequently, a current I can be conducted via the first line 11, the layer stack 8 and the second line 12 by respectively biasing the first line 11 and the second line 12 with electrical potentials V1, V2 that are different from one another. The layer stack 8 has a layer made of a solid electrolyte 6 and also a metal-containing layer 7 adjoining the solid electrolyte. The metal-containing layer 7 contains a metal such as silver, for example, which can diffuse in ionic form into the layer made of the solid electrolyte 6 if a sufficiently large voltage is present between the first line 11 and the second line 12. The non-reactive resistance of the layer stack 8 is thereby altered, and the memory cell 5 acquires low resistance.

Figure 3:
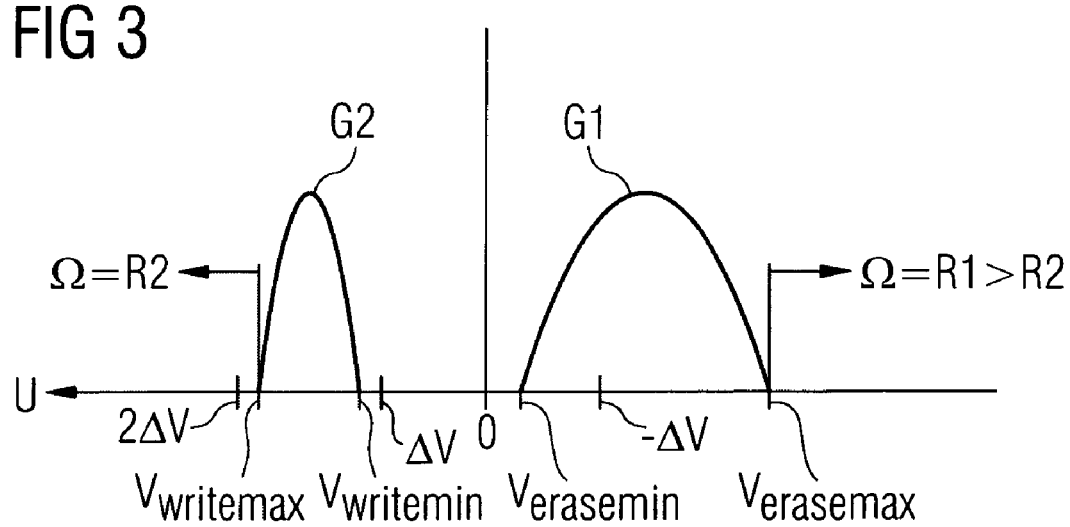
FIG. 3 shows the voltage dependence of threshold values for write and erase voltages of a solid-electrolyte memory device.

FIG. 3 shows the dependence of the threshold values for the write and erase voltages of the solid-electrolyte semiconductor memory from FIG. 1. The frequency with which, in an integrated semiconductor memory having a relatively large number of solid-electrolyte memory cells, a specific threshold value for a specific level of the erase voltage or write voltage occurs is plotted as a function of the voltage U applied to an arbitrary memory cell. The function values thus correspond to the number of memory cells in which the threshold voltages precisely assume the relevant value U.

The solid-electrolyte memory cells can be programmed (in a low-resistance state), so that they assume a low-resistance programming state. The memory cells can likewise be erased, i.e., programmed in a high-resistance state.

The threshold values G1 for the erase voltages have a relatively large bandwidth between the two limit values Verasemin and Verasemax. Verasemax is a limit value for a negative erase voltage below which an arbitrary memory cell is reliably erased. This means that the magnitude of the erase voltage to be applied must be greater than the magnitude of Verasemax, but the erase voltage must have a negative value. The voltage range below the limit value Verasemax is thus the voltage range of negative voltages that are greater in terms of magnitude than Verasemax.

Verasemin is a limit value for a negative voltage above which an erase operation is reliably prevented. Lying between Verasemin and Vwritemin is the range of those voltage values at which the memory cells of the semiconductor memory, if biased with such a voltage value, maintain their memory state. This range may in particular also encompass such positive voltage values which are less than Vwritemin but greater than the magnitude of Verasemin. Verasemax is the minimum value for the magnitude of a negative voltage with which an arbitrary memory cell of the semiconductor memory is reliably erased. In memory cells which are not permitted to be erased, by contrast, the voltage present is not permitted to be less (i.e., negative and greater in terms of magnitude) than Verasemin.

The threshold values G2 for the write voltages lie in the range of positive voltages and have a smaller bandwidth than the threshold values G1 for the erase voltages. Vwritemax is a limit value for a programming voltage above which an arbitrary memory cell is reliably programmed.

In solid-electrolyte memory cells, the bandwidth of the threshold values G2 for the write voltages between Vwritemin and Vwritemax is small enough to enable an item of information to be written in an individual memory cell 5 of the semiconductor memory 1 from FIG. 1 without there being the risk of further memory cells being simultaneously overwritten. Since, as can be discerned from FIG. 1, a plurality of memory cells 5 are connected to each first line 11 as well as to each second line 12, a biasing of a first or second line with a voltage that is greater in terms of magnitude than Verasemax or Vwritemax would lead to the reprogramming of all the memory cells connected to the affected line. A selective programming access to an individual memory cell can therefore be performed only by applying to a selected first line and a selected second line two partial voltages to reprogram the memory cell 5 at the crossover location of the selected first line and the selected second line. A simultaneous programming of such memory cells which are connected either to the same first line or to the same second line as the memory cell to be programmed is avoided because only one of the two partial voltages is present at these memory cells. Unintentional programming of these memory cells can be prevented in particular if each partial voltage is half as large as the programming voltage and at the same time less than Vwritemin.

An individual memory cell can be accessed during writing for example by the potential of the first line to which the memory cell to be programmed is connected being raised by half the write voltage and the potential of the second line to which the memory cell to be programmed is connected being lowered by half the write voltage. A positive voltage which corresponds to the write voltage and is greater in terms of magnitude than Vwritemax is then present at the memory cell. Those further memory cells which are connected to the same first line but to a different second line are biased with a voltage which is half as large as the write voltage used for selective programming. Those memory cells which are connected to the same second line as the memory cell to be programmed, but are connected to a different first line, are also likewise protected against simultaneous overwriting; they likewise have present at them a voltage amounting to half the write voltage, since the potential of the second line was lowered by just this magnitude.

Figure 4:
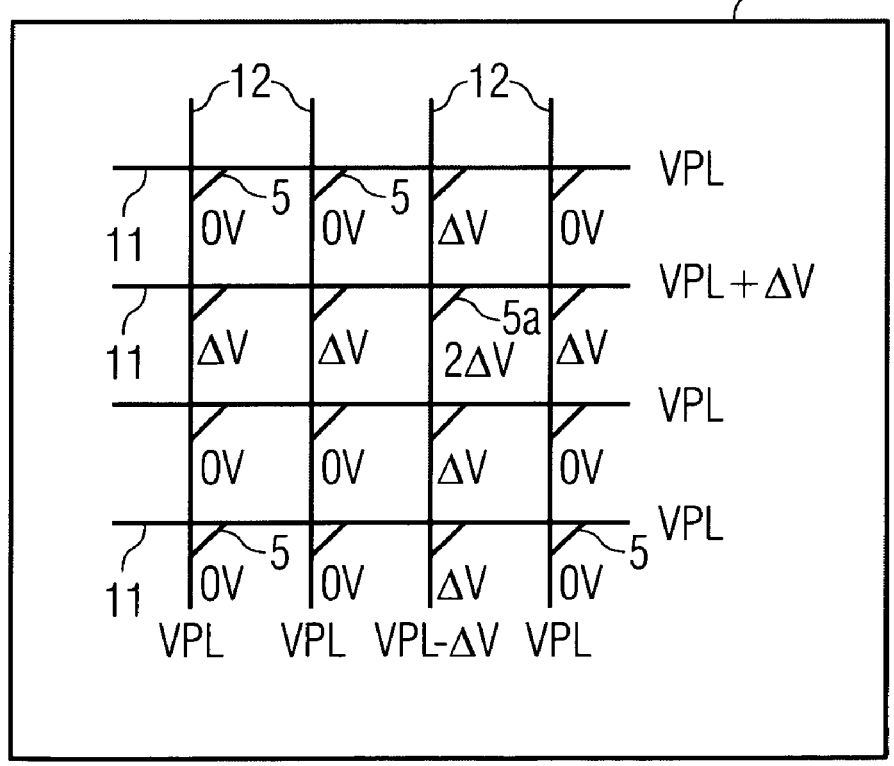
FIG. 4 shows a schematic plan view of a solid-electrolyte memory device with indication of potentials applied to its lines.

FIG. 4 shows a schematic illustration of a memory device 10 with a plurality of memory cells 5 which are connected to first lines 11 and to second lines 12. The memory cells are illustrated only schematically in the circuitry illustration of FIG. 4; they are preferably formed as layer stacks as in FIGS. 1 and 2. The memory cells 5 in FIG. 4 are, in particular, solid-electrolyte memory cells whose memory elements have a solid electrolyte and a metal-containing layer adjoining the latter. Such solid-electrolyte memory cells have an electrical switching behavior as illustrated in FIG. 3.

FIG. 4 illustrates the bias voltages applied to the first 11 and second lines 12 and also the resultant electrical voltages which are present at the memory cells, for the case where a memory cell is programmed in a low-resistance state. In principle, each first line 11 and also each second line 12 is biased with a reference potential VPL. This ensures that all the items of memory information are retained. For the programming of a selected memory cell 5a, in particular for the reprogramming of the memory cell into a low-resistance state, that first line 11 to which the memory cell 5a is connected is biased with a potential which is higher than a reference potential VPL by a partial voltage ΔV. At the same time, that second line 12 to which the selected memory cell 5a is connected is biased with a potential which is lower than the reference potential VPL by the partial voltage ΔV. As a result, a voltage of 2ΔV is present at the memory cell 5a to be programmed in a low-resistance state, which voltage, as can be seen in FIG. 3, is large enough to reliably program the memory cell 5a in a low-resistance state. A voltage of ΔV is present at those memory cells 5 which are connected to the same first line 11 as the memory cell 5a to be programmed, and at those memory cells which are connected to the same second line 12 as the memory cell 5a to be programmed. However, this voltage is small enough, as can be discerned in FIG. 3, to prevent unintentional programming of these memory cells.

In the case of memory devices as in FIGS. 1-4 in which the memory cells are arranged in a cross-point array, at each memory cell leakage currents occur between the respective first line 11 and the respective second line 12 to which the memory cell is connected. At least in those memory cells which are programmed in a low-resistance state, a leakage current contribution arises which, summed over many low-resistance memory cells, as the line length of the first or else second interconnects increases, may become so large that a reliable access to the memory cells lying far from the voltage supply of the first and second lines is not ensured or is ensured only to a restricted extent. The number of memory cells which are connected to a single line is therefore limited in conventional memory devices. If a voltage is applied to a line, then the leakage current contributions of the low-resistance memory cells bring about a decrease in the potential along the biased line as the path length of the interconnect increases, in particular as the number of memory cells which are programmed in a low-resistance state and are connected along this path length increases. Consequently, the potential applied at one end of the line is in reality not present on the entire interconnect; rather, the line has a potential gradient between the biased end of the interconnect through to the opposite end of the interconnect. The lower the resistance of the memory cells, i.e., the smaller the non-reactive resistance of the memory cells programmed in a low-resistance state, the fewer memory cells programmed in a low-resistance state that suffice to achieve a certain magnitude of the voltage drop. The lower the resistance of the memory cells programmed in a low-resistance state, the more the functional reliability of the memory device is jeopardized.

In order to keep such a voltage drop small, the semiconductor memory according to the invention provides for the inversion of the data values to be stored along individual lines, for example the word lines, if this reduces the number of memory cells programmed in a low-resistance state along the respective line.

Figure 5:
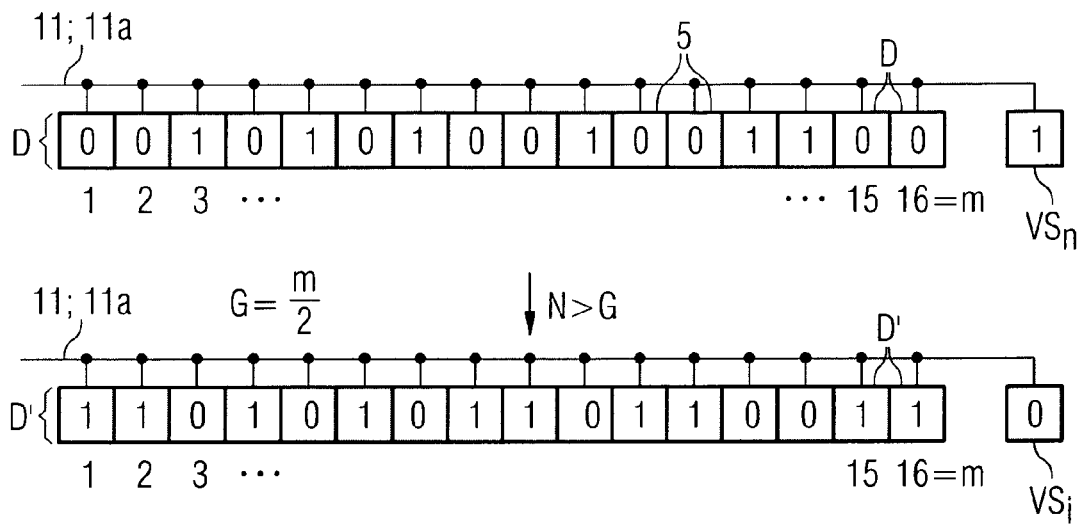
FIG. 5 shows a schematic illustration of a first exemplary embodiment of a memory-internal inversion of data values, according to the invention.

FIG. 5 shows a first example of such an inversion of data values, it being assumed that the data values are zero or one and are to be written to memory cells which are connected to a specific line, for example a specific word line 11a. In FIG. 5, m=16 memory cells are connected to the line 11a along which the data values D are to be stored. A further memory cell, in which a data bit VS is to be stored is additionally provided. The data bit VS represents the inversion state of the data values D which are to be written to the 16 memory cells connected to the line 11a. The memory cell in which the data bit VS for the inversion state is to be stored may likewise be connected to the same line 11a to which the memory cells for the 16 data values D are also connected. In such a case, the number of memory cells which can be utilized for the data values D is one less than the number of all the memory cells connected to the respective line 11a. In FIG. 5, however, the parameter m is chosen such that it represents the number of those memory cells connected to the line which are available for the storage of the data values D themselves. In accordance with FIG. 5, 16 data values D amounting to zero or one are illustrated in a first data row and are assigned to the corresponding memory cells 5. An additional data bit VS, which assumes the value one, specifies that the data values D are present in the original, non-inverted state. The data values D have not yet been stored in the memory cells of a memory cell array, but rather have initially only been buffer-stored in order to enable in the memory device a check to determine whether an inversion is appropriate for the data values D in order to keep down the number of memory cells along the same line which acquire low resistance during programming. In accordance with FIG. 5, the memory device performs a check which involves firstly determining the total number N specifying how many of the data values D are programmed in a low-resistance state. Assuming that a data value zero corresponds to a memory cell to be programmed in a low-resistance state, the data set of the data values D of the upper data row in FIG. 5 contains precisely 10 data values that lead to low-resistance memory cells during storage. These are the data values that are to be stored in the memory cells with the ordinal numbers 1, 2, 4, 6, 8, 9, 11, 12, 15 and 16. The memory device carries out a check to decide whether or not the data values D as described above are inverted. This check involves checking whether the number N of data values D which correspond to a memory cell to be programmed in a low-resistance state is greater than a predefined limit value G. In accordance with the example of FIG. 5, the limit value G is chosen such that it is half as large as the number of memory cells connected to the line 11a which are available for the 16 data values to be stored. In FIG. 5, m=16; in the case where a number of G=8 memory cells to be programmed in a low-resistance state is exceeded, the memory device ensures that the data values D which are to be written along the line 11a to the memory cells connected thereto are inverted prior to storage. In this case, the inversion carried out is instigated by the memory device if the original data set contains more than G=8 data values D whose storage results in the respective memory cells acquiring low resistance. Consequently, as illustrated in the second data row as in FIG. 5, an inverted data set D' is obtained in which all 16 data values and also the value of the data bit VS are inverted. This data set contains, including the inverted value of the data bit VS, only 7 data values which correspond to a low-resistance programming state during storage. Therefore, the inverted data set D' and the inverted data bit VS (having the value zero) are actually stored instead of the original data values D and the original, non-inverted data bit VS (having the original value one). In the case of the convention used in FIG. 5, a data bit VS having the value 1 corresponds to a non-inverted state of the data values D and a data bit VS having the value 0 corresponds to an inverted state, as indicated by the indices n and i for the data bit VS.

Figure 6:
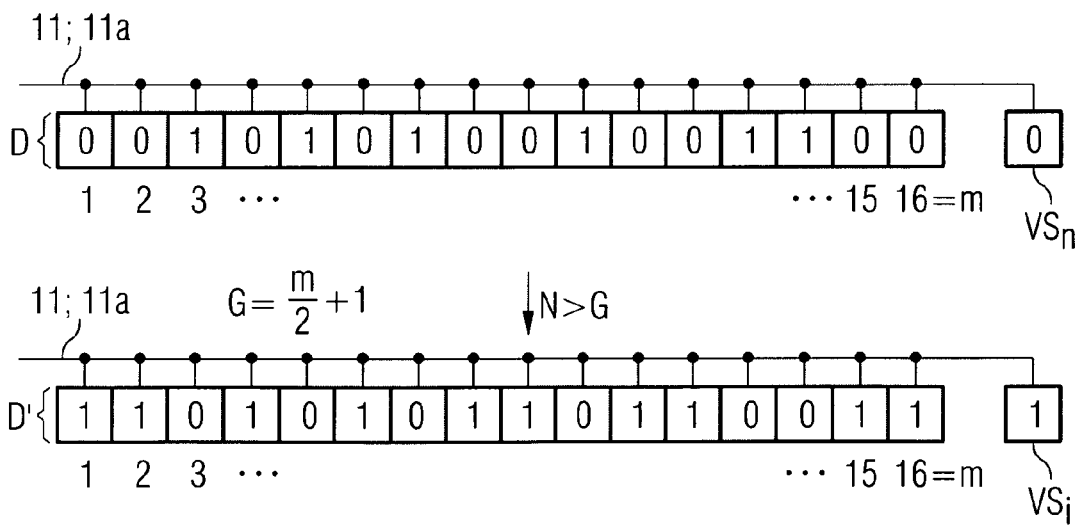
FIG. 6 shows a schematic illustration of a further exemplary embodiment of a memory-internal inversion of data values, according to the invention.

FIG. 6 shows a further exemplary embodiment of an inversion of data values of the memory device according to the invention which is performed in the region of a line, for instance a first line 11a. In contrast to FIG. 5, only the convention for the value of the data bit VS is changed; in accordance with FIG. 6, a data bit VS having a value zero corresponds to a non-inverted state and a data bit VS having the value one corresponds to an inverted state. In accordance with FIGS. 5 and 6, a digital zero corresponds to a memory cell that is to be programmed or is programmed in a low-resistance state, and a digital one corresponds to a memory cell that is to be programmed or is programmed in a high-resistance state. In accordance with FIG. 6, the data bit VS is counted among, a number of memory cells which are to be programmed in a low-resistance state. Consequently, the limit value G=(m/2)+1. Since the specific data set D in FIG. 6, which is to be written to the memory cells connected to the line 11, meets the inversion condition (N=11 data values amount to zero; the limit value amounts to only G=9), an inversion of data to be stored is performed in this case too.

The inversions illustrated by way of example in FIGS. 5 and 6 take place for data sets which are to be stored along individual lines, for example along first lines 11. A memory device has a plurality of such first lines 11. For each of the lines 11 a check is made to determine whether, for the respective first line 11, an inversion of the associated data values leads to a reduction of memory cells to be programmed in a low-resistance state. If this is the case, the data set provided for the respective first line 11 is firstly inverted prior to the storage. The decision as to whether or not such a data set is inverted is taken independently for each of the first lines 11 of the memory device. During the storage, moreover, a data bit VS is additionally stored for each first line 11, which data bit VS specifies whether the data values stored along the respective first line 11 have been stored in an inverted state or in the original, non-inverted state.

Figure 7:
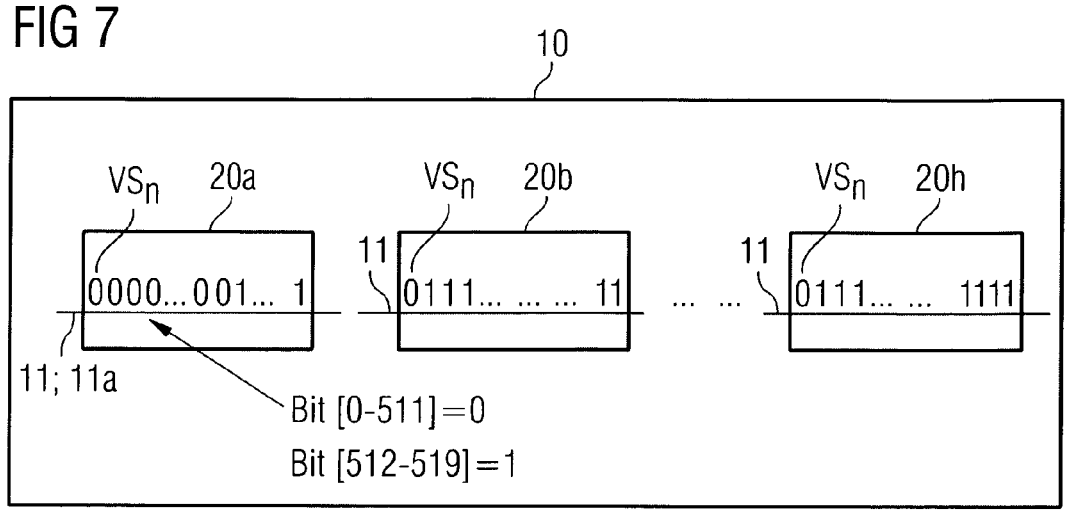
FIG. 7 shows a schematic illustration of a memory device with a plurality of memory blocks, according to an exemplary embodiment of the invention.
Figure 8:
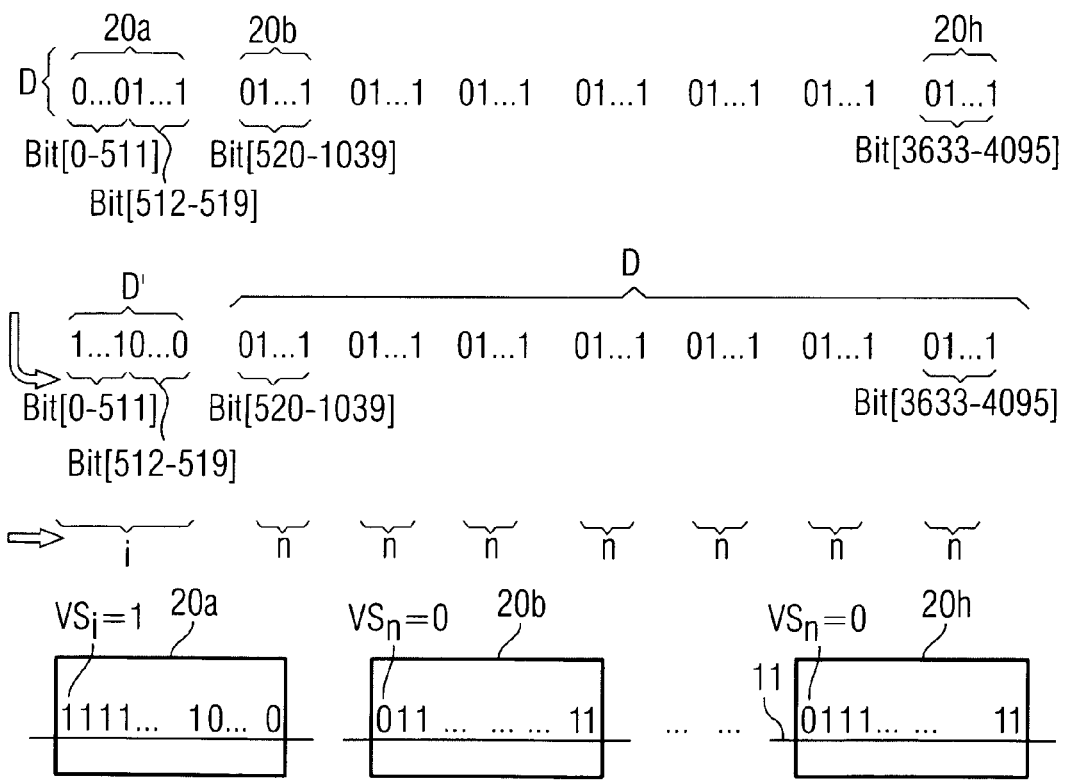
FIG. 8 shows a schematic illustration of a memory-internal partial inversion of data values in the memory device in accordance with FIG. 7.

FIG. 7 shows a schematic illustration of a memory device 10 having a plurality of memory blocks 20a, 20b, . . . , 20h. Each of the memory blocks is formed for example like the memory block 20 in FIG. 1. This means that, within each memory block 20a, 20b, . . . , 20h, the memory cells are interconnected by first lines 11 and by second lines 12. The memory cells of a plurality of memory blocks are, however, not interconnected by first or second lines 11, 12. During operation of memory device 10, a first line 11 having a specific line number that is identical for all the memory blocks is driven simultaneously in each memory block, by way of example. Such a line 11 is illustrated for all the memory blocks in FIG. 7. Furthermore, FIG. 7 specifies by way of example in this respect data values which are intended to be stored along the respective first line 11 in the memory cells which are connected to the respective first line 11. In FIG. 7, it is assumed for example that 520 memory cells are connected to the first line 11 of each memory block. Of the 520 connected memory cells, the first memory cell serves for storing the data bit VS for identifying the inversion state for the rest of the data values of the memory cells connected to the respective first line 11. In FIG. 7, in each memory block 20a, 20b, . . . , 20h, the respective first bit from the left is the data bit VS; it has the value zero and represents a non-inverted state of the data values, as identified by the reference symbol $VS_n$. A further 519 data values having the value one are otherwise stored in the memory blocks 20b to 20h. Only in the first memory block 20a are (in addition to the data bit $VS_n$) the first 511 data values zero and the last 8 data bits (namely the bits 512 to 519) equal to one. In this example, a data value one is intended to correspond to a memory cell programmed in a high-resistance state and a data value zero is intended to correspond to a memory cell programmed in a low-resistance state. Consequently, in the memory blocks 20b to 20h, the data values to be stored along the respective first line 11 have already been optimized to a minimum number of memory cells to be programmed in a low-resistance state. In this memory block, only the data bit $VS_n$ corresponds to a memory cell programmed in a low-resistance state (in accordance with the convention used). In the first memory block 20a, the majority of the total 520 data values correspond to a memory cell to be programmed in a low-resistance state. In the case of a storage without previous inversion, the potential along the relevant first line 11 would not be ensured or would not be reliably ensured over the entire interconnect length. Therefore, an inversion is performed according to the invention, in the case of which the affected first line 11, but only the one in the first memory block 20a, stores inverted data. On account of the invention described with reference to FIG. 6, the semiconductor memory firstly ascertains that the condition for an additional inversion step is met for the first line 11 of the first memory block 20a that is taken into consideration here, so that the first 512 bits (the data bit itself is included here) are converted into a digital one and the last 8 bits are converted into a digital zero. Carrying out the inversion step involves inverting the data values for the first line 11 taken into consideration here thus only within the first memory block 20a. For the first lines 11 of the rest of the memory blocks 20b, 20h that are taken into consideration here, however, the original data values D are stored without an inversion being performed. This results in the data pattern illustrated in the second and last rows of FIG. 8. The data bits VS indicating the inversion state reveal that the data are stored in inverted manner only in the first memory block 20a and non-inverted data values are stored in all the remaining memory blocks 20b, . . . , 20h, as indicated by the indices i and n of the respective data bit VS. Consequently, according to the invention, the entire page, i.e., the entire set of data values which are to be stored during a storage operation, is not inverted. Rather, for subsets of the data values of a page, individually a check is made and a decision is taken as to whether or not the data values of the respective subset are inverted. In particular, possible inversions are performed separately for each memory block ("array") and independently of the rest of the memory blocks. Furthermore, within each memory block, the data values for memory cells which are connected along individual lines are inverted independently of the data values along the rest of the lines, so that, for each line within the respective memory block, a separate decision is taken as to whether or not the data values are inverted along the respective line. Moreover, data values can be inverted according to the invention along partial sections of any arbitrary line selectively with respect to the remaining partial sections of the relevant lines.

The decision described here, which is instigated only within each individual memory block individually and independently of the rest of the memory blocks, as to whether an inversion of data to be stored is performed is restricted to a data set that is stored along the same first line 11 within the respective memory block. Each memory block has many further first lines 11 for which a check is likewise instigated to determine whether the number of low-resistance memory cells along the respective first line 11 within the respective memory block can be reduced by an inversion of the data values. For each of the first lines 11 within a memory block, the decision as to whether or not the data are inverted will be able to turn out differently, to be precise, depending on which data values (as an alternative to the data rows used by way of example in FIGS. 5 and 6) are to be stored in the memory cells which are connected to the respective first line 11. If the intention is to make it possible to decide for different sections of the first lines independently of one another whether an inversion is performed along the respective section, it is necessary to provide, for all the sections of the first lines, a data bit that identifies whether or not an inversion has been performed along the respective section of the relevant line.

Figure 9:
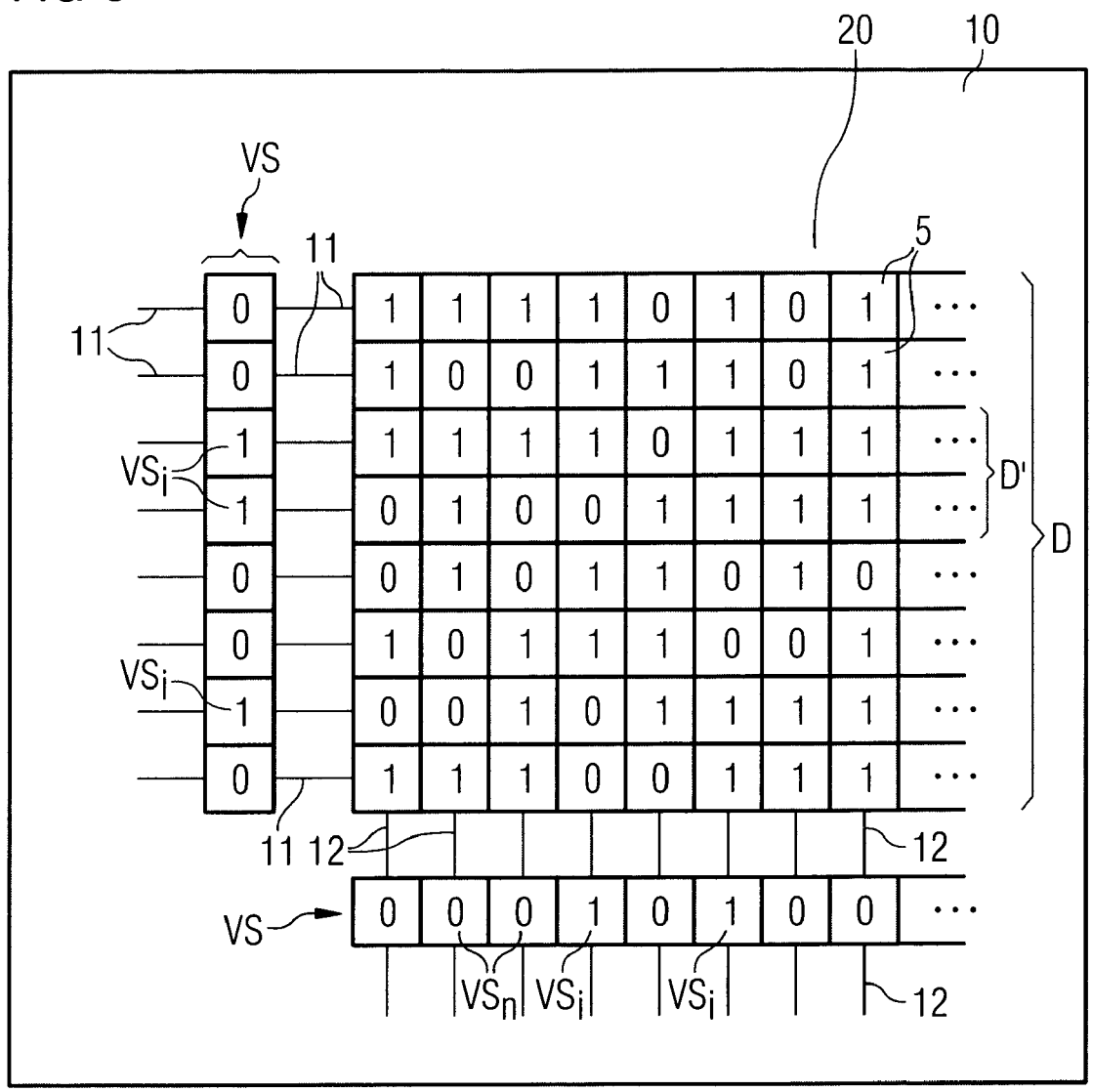
FIG. 9 shows a schematic illustration of a memory device according to an exemplary embodiment of the invention with stored, partly inverted data values.

FIG. 9 shows a schematic plan view of a memory device 10 according to the invention with a memory block 20 of memory cells 5 which are connected to first lines 11 and to second lines 12, namely to word lines and bit lines. FIG. 9 illustrates by way of example data values D which are stored in the memory cells 5 and assume the numerical value 0 or 1. In accordance with FIG. 9, it is provided, for example, that a data value having the value 1 is stored in the form of a memory cell programmed in a high-resistance state. Accordingly, a data value 0 corresponds to a memory cell programmed in a low-resistance state. Those memory cells in which the data value zero is stored lead to greater leakage current contributions than the memory cells programmed in a high-resistance state. The more low-resistance memory cells programmed with a zero are stored along a first line 11 (for example a word line) or along a second line 12 (for example a bit line), the greater the voltage gradients which occur at the line end over the interconnect length of the respective first or second line. This leakage-current-dictated restriction of the functional liability is eliminated by the inversion of data values which is performed row by row or else column by column according to the invention. This is done by virtue of the fact that when more memory cells programmed in a low-resistance state than high-resistance memory cells are connected to a specific line, for example a first line 11, they are inverted prior to the storage and then the inverted data values are stored instead of the original, non-inverted data values.

In FIG. 9, a data bit VS is provided for each first line 11 and for each second line 12, the value of the data bit VS specifying whether the data values stored along the respective first or second line were stored in inverted manner or in non-inverted manner. Using the example of FIG. 9, it can be discerned from those bits $VS_i$ having the value 1 that data values stored along the first line 11 and second lines 12 provided with this data bit were inverted. For the rest of the first and second lines, the data bit $VS_n$ having the value 0 specifies that no (row-by-row or column-by-column) inversions of data values were performed along these lines.

Figure 10:
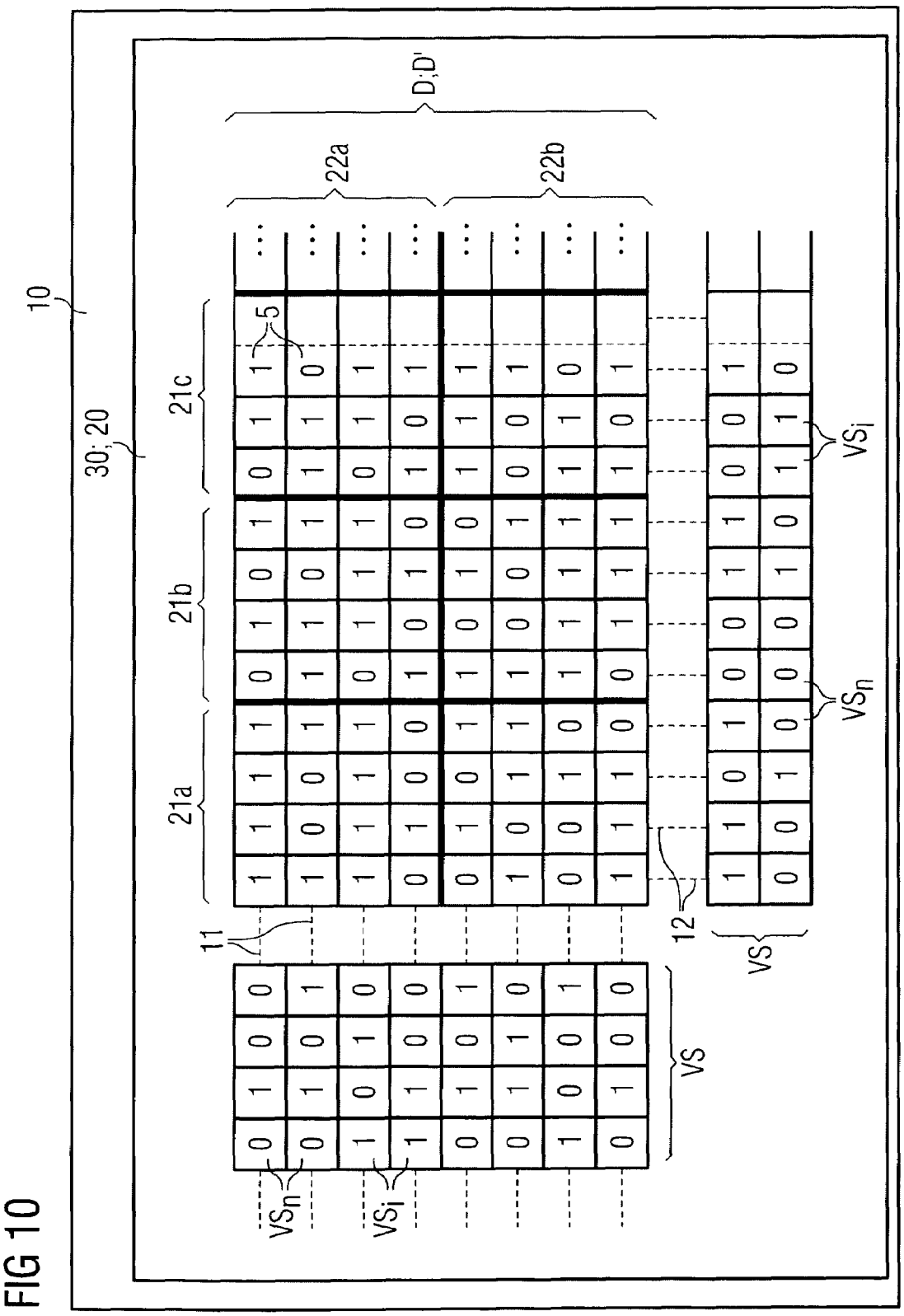
FIG. 10 shows a schematic illustration of a memory device according to another exemplary embodiment of the invention.

FIG. 10 shows a schematic plan view of an alternative embodiment of a memory device 10 according to the invention. In the case of the memory device in accordance with FIG. 10, a plurality of data bits VS that identify inversion states are stored for each of the first lines 11 and second lines 12. In contrast to FIG. 9, each data bit identifies only the inversion state of data values that are stored along individual sections of the respective first or second line 11, 12. Thus, in FIG. 10, four data bits VS are provided for each first line 11, which data bits are illustrated in a manner combined in a block of 4×8 data bits VS on the left in FIG. 10. These data bits are respectively assigned to sections 21*a*, 21*b*, 21*c*, . . . of the first lines 11. In the exemplary illustration of FIG. 10, four memory cells are connected to each section 21*a*, 21*b*, 21*c* of the corresponding first line 11, the memory contents of which memory cells can be inverted jointly, to be precise independently of the remaining data values that are to be stored or are stored along the respective first line 1.1. Further data bits VS are likewise provided, which are assigned to the second lines 12 and in FIG. 10 are illustrated in an arrangement comprising two rows beneath the actual data values D; D'. Here, two data bits VS are provided for each second line 12, which data bits are respectively assigned to a section 22*a*, 22*b* of the respective second line 12. In the exemplary illustration of FIG. 10, a section 22*a*; 22*b* extends over four memory cells which are arranged along the respective second line 12. With the aid of the data bits VS for the sections 22*a*, 22*b* of the second lines 12, it is possible, along an arbitrary second line 12, to jointly invert four data values which are stored within the same section 22*a* or 22*b* of the second line 12. Depending on the length of the first or second lines and the size of their interconnect sections, i.e., the number of data values that can be jointly inverted simultaneously, the number of inversion data bits which are respectively assigned to a first or second line may be chosen with an arbitrary magnitude.

The data bits $VS_n$ having the value 0 may indicate, for example, that the four successive data bits are stored or are to be stored in the non-inverted state along the respective section of the first or second line. Accordingly, those data bits $VS_i$ having the value 1 indicate that an inversion of the relevant four data values has been performed or is to be performed along the relevant section. In FIG. 10, by way of example, in the block of 4×8 data bits VS, the left-hand column of eight data bits may be assigned to the respective first sections 21*a* of the first lines. The next column of eight data bits is then assigned to the respective second interconnect sections 21*b* of the first lines, etc. Analogously, in the block comprising two rows of data bits for the second lines 12 which is illustrated beneath the data values D; D' to be stored, the data bits of the upper row which identify the inversion states are assigned to the upper sections 22*a* of the respective second line 12 and the lower bits are assigned to the lower sections 22*b* of the second lines 12. Instead of being stored in the memory block 20 itself, the data values D; D' and the data bits VS for the inversion states for the sections of the first and second lines may also firstly be buffer-stored in a buffer memory 30, for example in an SRAM, in which the inversions are performed before the actual storage operation in the memory block or memory blocks 20 is performed. Particularly in the case of solid-electrolyte memories, it is preferably provided that the data values D to be stored are firstly stored in the buffer memory 30, that the inversion steps for the first and/or second lines 11, 12 or for the interconnect sections 21*a*, 21*b*, 21*c*, 22*a*, 22*b* are performed therein, and that only afterward are the data values to be stored together with the data bits for the inversion states (or alternatively only the data values D; D') transferred into the memory cells of the memory block 20.

The embodiment in accordance with FIG. 10 is advantageous particularly when the page, i.e., the set of data values to be stored jointly, is shorter than the length of the first or second lines, i.e., when, along the first lines 11 for example, not all the memory contents are intended to be overwritten, but rather only the memory contents along a partial section of the relevant first line. With the aid of the possibility of selectively inverting data values along interconnect sections, arbitrary pages or data patterns can be optimized toward a smallest possible number of memory cells programmed in a low-resistance state.

Figure 11:
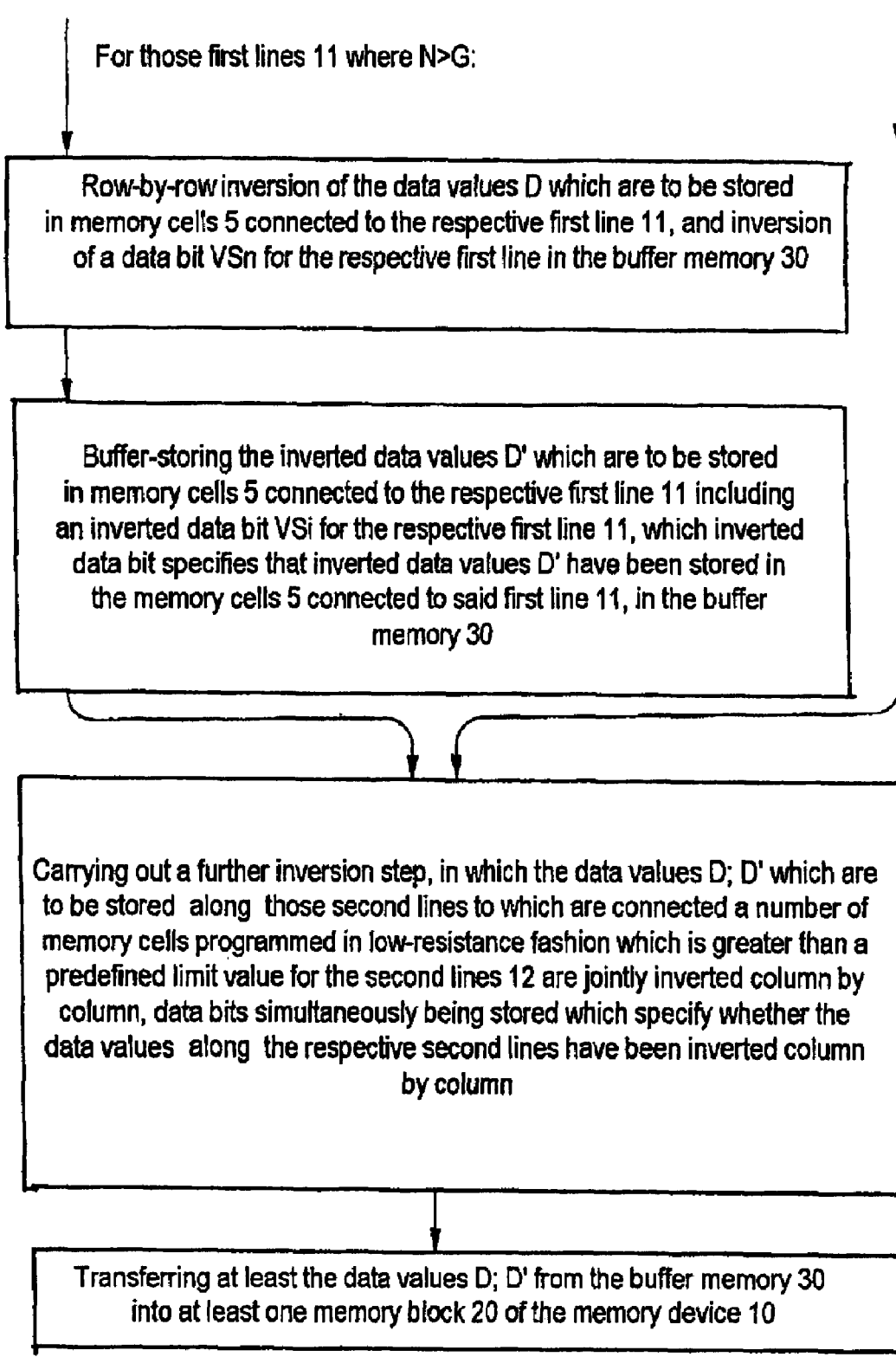
FIG. 11 shows a flow diagram for a method for operating a memory device according to an exemplary embodiment of the invention.

FIG. 11 shows an example of a method according to the invention for operating a memory device. Firstly, provision is made of the device 10 having a plurality of memory cells 5 which are connected to first lines 11 and to second lines 12 and can be programmed in a high-resistance state or in a low-resistance state depending on the magnitude and polarity of a voltage U present. Data values to be stored are then input into the memory device, and, according to the invention, a check is made for each first line to determine whether, among the data values which are to be written to the memory cells 5 connected to the respective first line 11, the number N of those data values which correspond to a memory cell 5 to be programmed in a low-resistance state is greater than a predefined limit value G. For those first lines 11 for which the number N is less than or precisely equal to the limit value G, the data values are stored in the memory cells 5 connected to the respective first line 11, to be precise, including a data bit $VS_i$ for the respective first line 11, which data bit specifies that non-inverted data values D have been stored in these memory cells 5.

By contrast, for those first lines 11 for which the number N is greater than the predefined limit value G, the data values which are to be stored in memory cells connected to the respective first line are first inverted and only then stored (in the inverted state). In this case, a data bit $VS_n$ for the respective first line is simultaneously inverted into a data bit $VS_i$ which is assigned to the respective first line 11 with inverted data values. Only afterward are the memory cells overwritten for these first lines for which the number N is greater than the predefined limit value, to be precise, via storage of the inverted data values D' including the inverted data bit $VS_i$ for the respective first line. The inverted data bit $VS_i$ indicates that an inversion was performed prior to the storage along the respective lines. After the data values have been stored in inverted manner or in non-inverted manner, depending on the occupancy of the corresponding first line with low-resistance and high-resistance cells, a further inversion step may optionally be performed, in which further data values along those second lines to which are connected more memory cells programmed in a low-resistance state than is permitted by a predefined limit value G for the second lines are inverted column by column. Here a data bit specifying whether the data values along the respective second line are inverted is also generated in each case. Consequently, each first line and second line may be assigned a respective data bit and the value of the respective data bit is chosen such that it can always be discerned whether an inversion of stored data or data to be stored has been performed along the respective first or second line. During a read-out operation, only up to two data bits then need to be concomitantly taken into account in order to ascertain whether or not a data value that is read out from the memory block 20 has to be inverted again. Consequently, the original data values can be recovered even when inversion steps have firstly been performed (once or iteratively) prior to the actual storage operation in the buffer memory (SRAM) in order to increase the voltage stability of the first and second lines.

With the aid of the present invention, a coding of a data set (page) of data values to be stored is made possible which reduces the number of low-resistance memory cells per word line and/or per bit line. The consequence of this is that the array size can be enlarged compared with a conventional memory device without impairing the operational reliability, at least along one type of lines, for example the word lines.

By means of an additional further inversion step, the second lines may also be made longer than in the case of the conventional semiconductor memories. With the aid of the present invention, cross-point arrays can be operated reliably for every type of resistively switching memory cells in conjunction with a larger number of memory cells. CBRAM memory cells (Conductive Bridging Random Access Memories) are suitable, in particular, which have solid electrolytes which are arranged in a layer stack and into which metal ions, for example silver ions, diffuse from an adjoining metal-containing layer and can also be driven out again upon application of a sufficiently high voltage of opposite polarity. The solid electrolyte main contain a chalcogenide, for example. The level of the average parasitic read currents is reduced with the aid of the row-by-row or column-by-column inversion according to the invention. Apart from solid-electrolyte memory cells, it is also possible, by way of example, to operate MRAM or PCRAM memory cells (magnetic RAM, phase change RAM).

Figure 12:
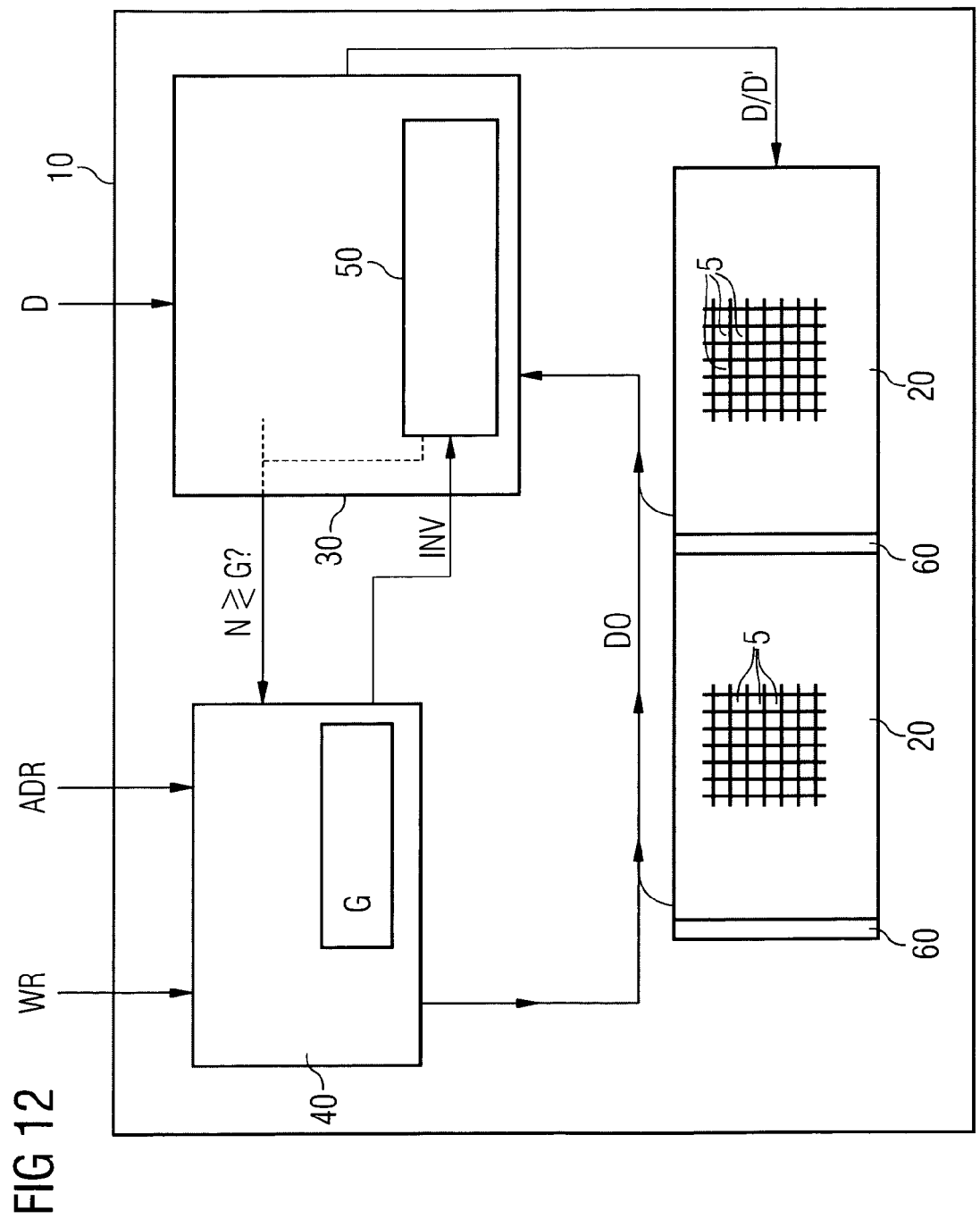
FIG. 12 illustrates a memory device according to an exemplary embodiment of the invention.

FIG. 12 illustrates a memory device according one exemplary embodiment of the invention. The memory device 10 preferably comprises a checking unit 40. Preferably the memory device 10 further comprises a buffer memory 30. Preferably the memory device 10 also further comprises a data inverting unit 50. The data inverting unit may form part of the buffer memory. The checking unit may include the buffer memory. Alternatively, the buffer memory may include the checking unit. Of course, the memory device may comprise a combined unit capable of performing all operations attributed to the checking unit, to the buffer memory and/or to the data inverting unit.

Finally, the memory device 10 may further comprise an auxiliary memory 60, for instance one respective auxiliary memory 60 for each memory block 20.

The checking unit 40 serves to perform the check which determines whether or not data values D to be stored in those memory cells 5a connected to the respective line 11a (or to a section 21a, 21b, 21c of the respective line 11a) are to be inverted prior to performing the storing operation (that is writing data into the memory cells). Preferably, the checking unit 40 permanently stores a limit value G indicating a maximum permissible number N of memory cells Sa programmed in a low-resistance state which are connected to the respective one line 11a or to the section 21a, 21b, 21c of the respective one line 11a.

According to FIG. 12, the memory device 10 receives or generates a writing command which may be sent to the checking unit 40, for instance. The memory device 10 further receives or generates an address command which may be sent to the checking unit 40. Furthermore, the memory device 10 further receives or generates an address command which may be sent to the buffer memory 30. When a storage operation is to be performed, prior to final storage of the received or generated data (preferably test data) in the memory cells of the memory array (which may include one or more memory blocks), the checking unit initiates transmission of data which previously, before the storage operation to be performed, are stored in memory cells connected to those lines (preferably word lines) or sections thereof which lines or sections thereof will be concerned by the storage operation to be performed. For instance, if data is to be stored in memory cells along a first word line, the data presently stored along the first word line is read from the memory array into the buffer memory 30. The buffer memory further provisionally stores the data to be written into the memory cells of the memory array by means of the storage operation to be performed.

The checking unit then requests from the buffer memory information as to whether the number N of memory cells which, after once having performed the storage operation, will be programmed in a low-resistance state is larger than a threshold value indication the maximum permissible number of memory cells per line (or per section of a line) programmed in a low-resistance state. In the event that this number N in greater (or greater than or equal to) the threshold value G, the checking unit transmits a data inverting command to the data inverting unit 50 which, upon receipt of the data inverting command, performs inversion of the data to be stored. Subsequently, the inverted data to be stored is written into the memory cells addressed by the address command. If no data inversion needs to be performed for reducing the number of memory cells per line (or per section of a line) programmed in a low-resistance state, the non-inverted data to be stored are written into the memory cells addressed by the address command.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

5 Memory cell
5*a* Selected memory cell
6 Solid electrolyte
7 Metallic layer
8*a* Memory element
8 Layer stack
10 Memory device
11, 11*a* First line
12, 12*a* Second line
20, 20*a*, . . . 20*h* Memory block
21*a*, 21*b*, 21*c* Section of a first line
22*a*, 22*b* Section of a second line
30 Buffer memory
40 Checking unit
50 Data inverting unit
60 Auxiliary memory
D Data value
D' Inverted data value
G; G1, G2 Threshold value
i Inverted memory state
I Current
n Noninverted memory state
N Number of memory cells programmed in a low-resistance state per line
R1 First value
R2 Second value
ΔV Partial voltage
U Voltage
Ω Nonreactive resistance
VS Data bit
$VS_i$ Data bit indicating an inverted storage
$VS_n$ Data bit indicating a noninverted storage
V1 First potential
V2 Second potential
Verasemax Limit value for an erase voltage below which an arbitrary memory cell is reliably erased
Verasemin Limit value for a negative voltage above which an erase operation is reliably prevented
Vwritemax Limit value for a programming voltage above which an arbitrary memory cell is reliably programmed
Vwritemin Limit value for a positive voltage below which a storage operation is reliably prevented
VPL Reference potential

What is claimed is:

1. An integrated memory device, comprising:
a plurality of memory cells individually comprising a memory element having a non-reactive resistance whose magnitude is programmable to assume either a first, high-resistance state or a second, low-resistance state, wherein the non-reactive resistance of a memory cell programmed in a high-resistance state is greater than the non-reactive resistance of a memory cell programmed in low-resistance state;
a plurality of first and second lines for accessing the memory cells, wherein the memory element of each memory cell is coupled between one of the first lines and one of the second lines; and
a checking unit configured to determine whether to invert data values to be stored in memory cells coupled to at least a section of respective first lines based on a number of memory cells that would be programmed in the high-resistance state or the low-resistance state as a result of the data values.

2. The memory device of claim 1, wherein the checking unit stores a limit value for a maximum permissible number of memory cells programmed in the low-resistance state that are coupled to said at least a section of a respective first line, and determines-whether the limit value would be exceeded by storing the data values in a non-inverted manner.

3. The memory device of claim 2, further comprising a data inverting unit that inverts the data values prior to storage in response to the limit value being exceeded.

4. The memory device of claim 3, wherein the memory device is configured such that an inversion is performed for a plurality of sections of each first line, the data inverting unit performing an inversion only for such sections of first lines for which the number of memory cells that are to be programmed in a low-resistance state can be reduced by an inversion.

5. The memory device of claim 3, wherein the memory device is configured such that an inversion is performed for a plurality of sections of each second line, the data inverting unit performing an inversion only for such sections of second lines for which the number of memory cells that are to be programmed in a low-resistance state can be reduced by an inversion.

6. The memory device of claim 2, wherein the limit value is half the number of memory cells connected to said at least a section of the respective first line.

7. The memory device of claim 1, wherein the checking unit, prior to a storage, determines whether the number of memory cells coupled to said at least a section of a respective first line that would be programmed in the low-resistance state is less in the case of storing inverted data values than in the case of storing non-inverted data values.

8. The memory device of claim 1, wherein, during each storage operation, the memory device additionally stores at least one data bit specifying an inversion state of the data values stored in memory cells coupled to said at least a section of the respective first line.

9. The memory device of claim 8, wherein the at least one data bit specifying the inversion state is stored in a first or last memory cell coupled to the respective first line.

10. The memory device of claim 1, further comprising an auxiliary storage for storing data bits specifying inversion states of data values stored in memory cells coupled to said at least one section of respective first lines.

11. The memory device of claim 1, wherein the checking unit determines, for each respective first line involved in a storage operation, whether the data values to be stored in memory cells coupled to at least a section of respective first lines are to be stored in a non-inverted manner or in an inverted manner to reduce a number of memory cells programmed in a low-resistance state, and wherein, during the storage operation, at least one data bit that is assigned to the respective first line and that specifies an inversion state of data values stored in memory cells coupled to the respective first line is stored additionally for each of the respective first lines.

12. The memory device of claim 1, further comprising a data inverting unit that inverts the data values for those first lines or sections of first lines for which the number of connected memory cells programmed in the low-resistance state is less in the case of an inverted storage than in the case of a non-inverted storage.

13. The memory device of claim 12, wherein the data inverting unit additionally inverts the data values for those second lines or sections of second lines for which the number of connected memory cells programmed in the low-resistance state is less in the case of an inverted storage than in the case of a non-inverted storage.

14. The memory device of claim 13, wherein the memory device stores, for each second line, at least one data bit that specifies whether an inversion that reduced the number of memory cells programmed in a low-resistance state was performed for the data values that are stored in memory cells coupled to the respective second line or the section of the respective second line.

15. The memory device of claim 1, wherein the memory device assigns to each section of an arbitrary first line and/or to each section of an arbitrary second line a data bit specifying whether data values have been stored in an inverted manner or in a non-inverted manner along the respective section.

16. The memory device of claim 1, further comprising a buffer memory for storing the data values, wherein inversion of data values is performed in the data buffer prior to storing data values in the memory cells.

17. The memory device of claim 1, wherein data values to be stored in memory cells coupled to respective first lines are inverted on a row-by-row basis.

18. The memory device of claim 1, wherein data values to be stored in memory cells coupled to respective second lines are inverted on a column-by-column basis.

19. The memory device of claim 1, further comprising a plurality of memory blocks containing the memory cells, each memory block having dedicated first and second lines by which the memory cells of a respective memory block are interconnected, wherein the memory device stores, for the first and second lines of each memory block, dedicated data bits that can be altered independently of one another and that identify an inversion state of memory cells connected to the respective first and second lines or to a section of the respective first and second lines only for an individual memory block.

20. The memory device of claim 1, wherein a magnitude of the non-reactive resistance of a respective memory element is alterable via a level and polarity of an electrical voltage between the first line and the second line coupled to the respective memory element.

21. The memory device of claim 1, wherein the memory elements acquire a high resistance through application of a sufficiently high programming voltage of a first polarity and acquire a low resistance through application of a sufficiently high programming voltage of a second, opposite polarity.

22. The memory device of claim 1, wherein the memory elements comprise layer stacks including a solid electrolyte and a metal-containing layer adjoining the solid electrolyte.

23. The memory device of claim 1, wherein the second lines extend in a transverse direction with respect to the first lines.

24. The memory device of claim 1, wherein the first lines are word lines and the second lines are bit lines.

25. A method for operating an integrated memory device, the method comprising:
  a) providing an integrated memory device comprising a plurality of memory cells connected to first lines and to second lines, the memory cells having a variable non-reactive resistance that is programmable such that the memory cells assume either a first, high-resistance state or a second, low-resistance state;
  b) supplying data values to be stored into the integrated memory device;
  c) determining for which first lines or for which sections of first lines a number of connected memory cells that are to be programmed in low-resistance state after a storage of the data values can be reduced by an inversion of the data values;
  d) inverting those data values that are to be stored in memory cells connected to such first lines or to such sections of first lines for which an inversion of the data values has been specified in c); and
  e) storing the data values resulting after performing d).

26. The method of claim 25, wherein a limit value is predefined for a maximum permissible number of memory cells programmed in a low-resistance state that are permitted to be simultaneously coupled to a first line or to a section of a first line, and c) involves determining for which of the first lines or sections of the first lines the number of connected memory cells that would be programmed in a low-resistance state after a storage of the data values is greater than the limit value.

27. The method of claim 26, wherein the limit value is selected to be half as large as the number of memory cells coupled to a first line.

28. The method of claim 27, wherein the limit value is selected to be greater than half the number of memory cells coupled to a first line.

29. The method of claim 25, wherein after e), those stored data values are inverted which are stored in memory cells coupled to such second lines or to sections of second lines for which the number of connected memory cells programmed in a low-resistance state can be reduced by an inversion.

* * * * *